United States Patent [19]

Butler

[11] Patent Number: 5,197,026

[45] Date of Patent: Mar. 23, 1993

[54] TRANSPARENT EEPROM BACKUP OF DRAM MEMORIES

[75] Inventor: Donald S. Butler, Scottsdale, Ariz.

[73] Assignee: Microchip Technology Incorporated, Chandler, Ariz.

[21] Appl. No.: 337,957

[22] Filed: Apr. 13, 1989

[51] Int. Cl.$^5$ .................... G11C 7/00; G11C 16/06; G11C 14/00

[52] U.S. Cl. .................... 365/104; 365/222; 365/228; 365/189.07

[58] Field of Search .............. 365/228, 94, 103, 104, 365/222, 189.07; 371/10, 10.1

[56] References Cited

U.S. PATENT DOCUMENTS

| | | | |
|---|---|---|---|
| 4,337,522 | 6/1982 | Stewart | 365/228 X |
| 4,584,663 | 4/1986 | Tanikawa | 365/228 X |
| 4,701,886 | 10/1987 | Sakakibara et al. | 365/189.07 X |
| 4,713,756 | 12/1987 | Mackiewicz et al. | 365/228 X |
| 4,716,552 | 12/1987 | Maltiel et al. | 365/222 |
| 4,796,235 | 1/1989 | Sparks et al. | 365/228 X |
| 4,800,533 | 1/1989 | Arakawa | 365/228 |
| 4,888,686 | 12/1989 | Sinz et al. | 365/189.07 X |

*Primary Examiner*—Alyssa H. Bowler
*Attorney, Agent, or Firm*—Donald R. Greene

[57] ABSTRACT

A system for backing up volatile memory such as DRAM with non-volatile memory such as EEPROM includes a volatile memory having refresh logic for cycling through the volatile memory address locations and refreshing the contents thereof, and a non-volatile memory having write logic for writing data into an address location of the non-volatile memory over a write cycle. Each of the volatile and non-volatile memories has its own address bus, and the address buses are connected together for reading out the contents of corresponding address locations of the two memories in the same sequence according to the cycle dictated by the volatile memory refresh logic. The contents read out of each corresponding pair of address locations of the volatile and non-volatile memories are compared in the sequence, and if a difference is detected between the compared contents the address buses are disconnected and a write cycle of the non-volatile memory is initiated to transfer data representing the contents of the address location of the volatile memory found to differ into the corresponding address location of the non-volatile memory.

14 Claims, 1 Drawing Sheet

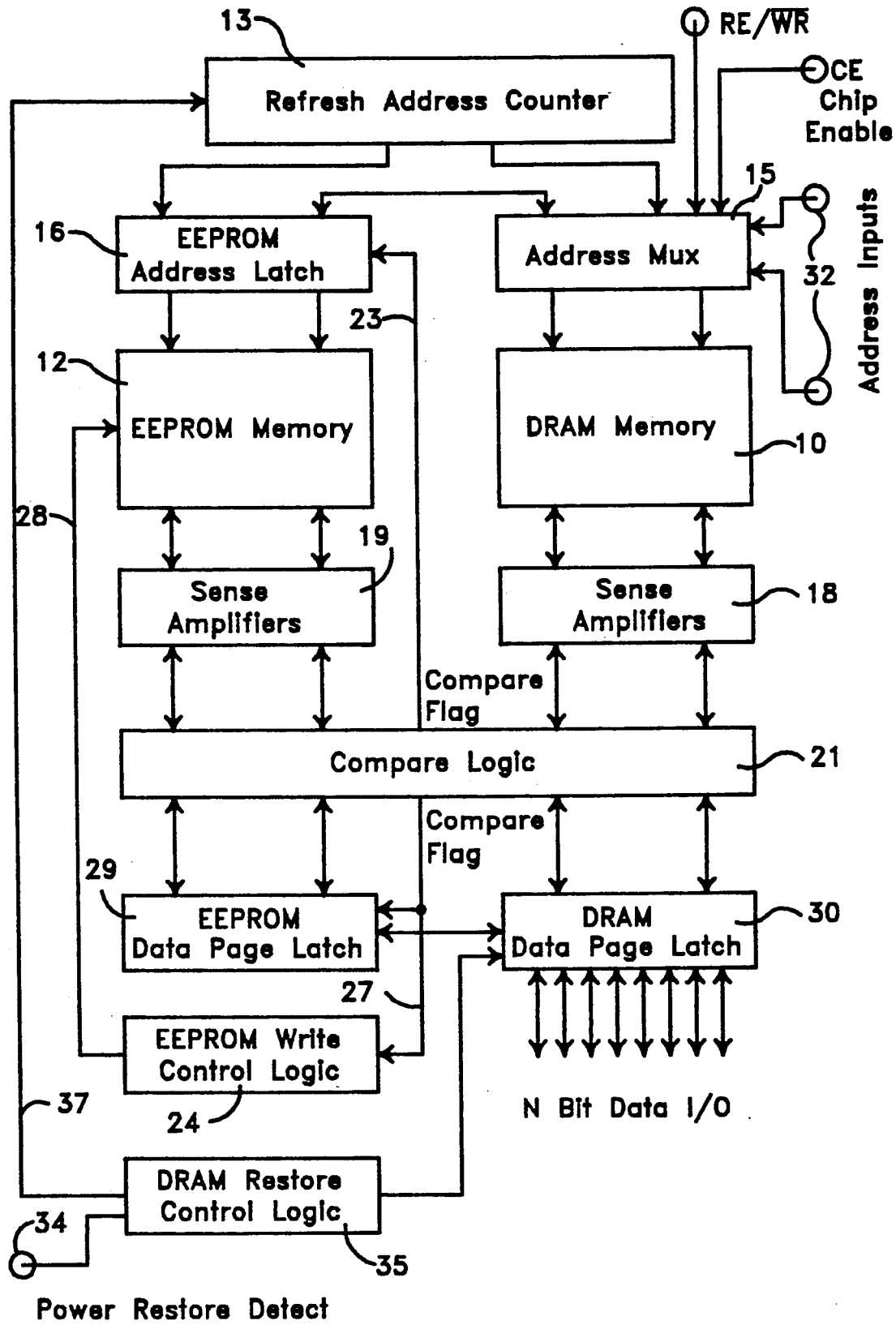

TRANSPARENT EEPROM BACKUP OF DRAM MEMORIES

BACKGROUND OF THE INVENTION

The present invention pertains to integrated circuit (IC) memory devices, and, in particular, to an IC memory that combines both dynamic random access memory (DRAM) and electrically erasable programmable read only memory (EEPROM) on the same substrate for fast initial transfer of data to the DRAM and subsequent slower backup copy to the EEPROM.

In some applications it is desirable to use both volatile memory, such as DRAM, and non-volatile memory, such as EEPROM, in the same device. By way of example, it is desirable to have EEPROM to keep track of a cable television descrambler configuration and authorized premium channels, but it is too costly and too slow. Therefore, DRAM has been preferred as the storage medium of choice in the latter instance because of its considerably lower cost per bit, and the faster write time available to download data into memory, as compared to EEPROM.

One of the problems encountered in developing such a split memory for backup purposes pertains to the technique and timing of transfer of the contents from the initial memory to the backup memory. In the case of DRAM, memory locations must be refreshed periodically to avoid data loss that would otherwise occur as a consequence of cell leakage currents. Although the necessary refresh may be accomplished using the main processing unit of the system, (MPU, or processor), the desire to unburden the processor of refresh timing dictates the use of logic local to the DRAM for cycling and refreshing the memory locations independent of the processor.

The transparent refresh logic operates continuously in the refresh mode except when interrupted by the processor each time a memory location of the DRAM is accessed by the system. System access is constrained sufficiently to assure that all locations are refreshed within the retention time of the DRAM memory cells. Normally, the refresh logic cycles through all of the memory locations in ascending order of their addresses, and, as each location is addressed, all of the bits on that row are read out through sense amplifiers and then rewritten back into memory. This read out and write back operating mode is characteristic of all DRAM memory refresh systems.

In the case of an EEPROM, data is written into memory by application of high voltage signals to the cells to inject the appropriate charge into the storage medium, which may be either a floating poly-silicon gate or an oxy-nitride interface. Whichever of these storage media is utilized, the time required for the write cycle typically ranges from hundreds of microseconds to several milliseconds, and is considerably greater than the time typically allocated to the write cycle for a DRAM cell. It is customary to incorporate logic into the EEPROM IC (or chip) to self-time the write cycle and thereby relieve the processor from the burdens of controlling the timing and of the need to wait for completion of the write cycle.

The present invention is based in part on the recognition of the great similarity between the logic required to control the DRAM refresh system and the logic employed to control the EEPROM write cycles.

In normal operation, a computer system will update and modify the contents of any incorporated DRAM. Because of the volatility of this storage medium, the contents of the DRAM will be lost in the event of a power failure. To assure that the data is maintained, it may be transferred to an EEPROM so that the EEPROM always has available the latest copy of the DRAM memory contents. The availability of the data in this manner allows the system to be restored and the operation restarted on power up, as though no power failure had occurred.

The period of time required for transferring the data from the DRAM into the EEPROM is of no great concern in the system operation because the computer is not normally addressing the EEPROM directly. However, this period is of significance when a power failure occurs, because the transfer period must be of sufficient duration to ensure that in a worse case scenario the entire contents of the DRAM memory will be transferred. That is, if the transfer of data is interrupted by a power failure, adequate independent power supply must be available to keep the chip "alive" while the last remaining bytes are transferred to the EEPROM memory. The length of the period in question is readily determined from an analysis of the proposed system, the maximum rate of data change in the DRAM, and the duration of the EEPROM write cycle.

It is an object of the present invention to provide a memory chip that combines non-volatile and volatile storage media on the same substrate.

In particular, it is another object of the invention to provide a combined DRAM and EEPROM memory system which utilizes this similarity in control logic to link the DRAM refresh and EEPROM write cycle operations, and to facilitate the EEPROM backup of the DRAM.

Another object of the invention is to provide such a combined, mixed, or split memory chip for fast initial transfer of data to the lower cost, faster write time volatile storage medium, with transparent backup of selected contents of the latter medium in non-volatile storage.

It is, therefore, another object of the invention to provide a method and apparatus for a non-volatile memory backup of a volatile memory, in which the backup is performed in such a way that the normal functions and uses of the volatile memory in terms of reading and writing data under the control of the system processor are unaffected by the procedure for backing up the data, and the backup is substantially continuous to assure availability in the backup memory of the latest data stored in the volatile memory to preclude loss of data in a power failure independently of externally accessing the volatile memory to read data therefrom or write new data therein.

Still another object of the present invention is to provide such apparatus in which separate hardware for the logical compare function is fabricated in the same monolithic chip with one or both of the memories.

SUMMARY OF THE INVENTION

To achieve the foregoing and other objects in accordance with the purposes of the present invention as embodied and broadly described herein, one aspect of the invention is the process wherein the contents of both the DRAM memory and the EEPROM memory are read out simultaneously in the same sequence, so that the data from each pair of locations (DRAM and EEPROM) may be compared on read out. If the contents of any pair are not the same, i.e., are not equal, an EEPROM write cycle is initiated in which the DRAM data is written into the appropriate EEPROM location.

Another aspect of the invention is a system for backing up volatile memory (DRAM) with non-volatile memory (EEPROM) in which the volatile memory has refresh logic for cycling through the volatile memory address locations and refreshing the contents thereof and the non-volatile memory has write logic for writing data into an address location of the non-volatile memory over a write cycle. Each of the volatile and non-volatile memories have its own address bus and means are provided for connecting the address buses of the volatile and non-volatile memories together for reading out the contents of corresponding address locations thereof in the same sequence according to the cycle dictated by the volatile memory refresh logic. The contents read out of each corresponding pair of address locations of the volatile and non-volatile memories in the sequence are compared. If there is a difference between the compared contents, the address buses are disconnected and a write cycle of the non-volatile memory is initiated to transfer data representing the contents of the address location of the volatile memory found to differ into the corresponding address location of the non-volatile memory.

In yet another aspect of the invention the means which disconnects the address buses separates the EEPROM address bus from the DRAM refresh logic to eliminate further cycling through the EEPROM address locations during the EEPROM write cycle, while maintaining a connection between the DRAM refresh logic and the DRAM address bus to continue cycling through the DRAM address locations and refreshing the contents thereof during the EEPROM write cycle.

In another aspect of the invention apparatus is responsive to the completion of the EEPROM write cycle and reconnects the address buses to reinstate the reading out of corresponding locations of the DRAM and EEPROM in normal sequence.

Accordingly, the EEPROM (or other non-volatile memory) provides a transparent backup for the DRAM (or other volatile memory), and always contains the latest data available.

BRIEF DESCRIPTION OF THE DRAWINGS

The above and other objects, features and advantages of the invention will become apparent from a consideration of the following detailed description of a preferred embodiment thereof, taken in conjunction with the accompanying drawings, in which:

The sole FIGURE is a block diagram of the preferred embodiment.

DETAILED DESCRIPTION OF THE PREFERRED EMBODIMENT

Referring now to the drawing, the invention preferably includes DRAM memory 10, EEPROM memory 12, and associated address buses, logic, amplifiers, latches, and other elements to be described, fabricated within a single monolithic silicon chip. Accordingly, the process technology employed to fabricate the device must be compatible with all of the elements to be formed therein. By way of example, CMOS process technology may be used for this purpose.

The conventional refresh logic of the DRAM 10, including address counter 13 and multiplexer 15, normally cycles through the address locations of the DRAM and returns the restored contents to their appropriate locations in that memory. As noted above, this means that the DRAM refresh logic makes the contents of each memory location available at some time during each refresh cycle. According to the invention, the DRAM address bus is organized to permit selective connection thereof to the address decoder of EEPROM 12 such that the contents of the EEPROM are read out in the same sequence as the DRAM.

To that end, the refresh address counter 13 is connected not only to the DRAM, via address multiplexer 15, but also to the EEPROM, through an address latch 16. Because the read access times of the two memories are quite similar, the contents of corresponding address locations of the DRAM and EEPROM are read out simultaneously through sense amplifiers 18 and 19, respectively. A suitable buffer stage may be used as an adjustment for any substantial difference in read access times to make the data from both memory locations available at the same time. A logical comparison is performed on the data being read out, by means of conventional compare logic 21. If the data read from the corresponding address locations are identical, the address buses of the DRAM and EEPROM remain connected together and the sequential read out of data from each pair of address locations continues, with a logical compare operation on each.

If, however, the comparison detects a difference between the two sets of data stored at a given pair of locations, a compare flag is set by compare logic 21 to set the address latch 16 via 23 and thereby effectively disconnect or separate the address buses of the DRAM and EEPROM. However, the refresh logic continues cycling through address locations of DRAM 10 in the normal manner, refreshing the contents of each, and is unaffected by the separation from the EEPROM address bus. Simultaneous with its separation of the two address buses, the compare flag also initiates an EEPROM write cycle through control logic 24 via 27. The EEPROM write cycle causes data from the DRAM location on which the last comparison was based to be written into the corresponding address location of the EEPROM by enabling the EEPROM programming via 28 while the data is transferred from an EEPROM data page latch 29 controlled by the compare flag. Latch 29 receives its data from a separate DRAM page latch 30 as a consequence of a mis-comparison (detection of a difference between the two sets of data stored in corresponding locations of the memories). The mismatch triggers the compare flag, the inception of the EEPROM write cycle and the transfer of data from DRAM page latch 30 into EEPROM page latch 29 and thence to EEPROM 12 as previously stated. At that point, then, the contents of the pair of locations (DRAM and EEPROM) which had just been compared and found unequal, are now identical and the EEPROM memory is providing the desired backup of the volatile DRAM. The EEPROM write cycle may cover many normal DRAM refresh cycles, but because the two address buses remain separated during that interval, the DRAM continues to be refreshed without encountering delay from the EEPROM write timing.

On completion of the EEPROM write cycle, the compare flag is removed and the refresh address counter again cycles through latch 16 and EEPROM 12 as well as through the DRAM. The read out and compare sequence then continues for corresponding address locations of the two memories until another disparity between data is uncovered, at which time the address buses are again separated by the compare flag and the EEPROM is updated to accurately back up the DRAM.

During any interval in which the buses are separated and the EEPROM write and DRAM refresh cycles are being performed, corresponding address locations having unequal contents in the two memories will go undetected as the DRAM addresses are sequentially accessed. This will not create a problem, however, because the disparity between the data stored in any such pair of locations will be uncovered and corrected in subsequent cycles of the refresh/compare operation. Moreover, this operation to continually provide updated backup of the DRAM is transparent to the system processor. If the processor inputs new data into a particular DRAM location (by means of a chip enable (CE), address inputs 32, and data I/O terminals of the DRAM data page latch 30) several times in a period when the two address buses are separated, there is no adverse effect from the standpoint of backup because a logical compare involving that location ultimately will result in a transfer of the most recent data stored therein into the appropriate EEPROM location. This is a satisfactory result since the backup operation is intended to maintain only the latest data for purposes of re-establishing system operation after a power failure.

Detection of power restoration at a chip terminal 34 triggers DRAM restore control logic 35 to allow the refresh counter 13 to run and transfer data from the EEPROM 12 into the EEPROM data page latch 29. At the same time, logic 35 enables the DRAM data page latch 30 to accept data transfer from latch 29, and thereby, restore the contents of the DRAM 10 over one cycle of the refresh counter.

The backup method of the present invention keeps the EEPROM memory updated by tracking data changes in DRAM locations generally within tens of milliseconds. It should not be inferred from the foregoing description that data comparisons must be performed one byte at a time. Indeed, memories in chip form are physically organized in multiple rows and columns, and the refresh is performed on a row by row basis. A 16K memory, for example, is normally laid-out in 128 rows and columns, and in that case the 16 bytes in a row are refreshed at the same time. Accordingly, the entire memory refresh will be completed in 1/16th of the time required to cycle through all of the addresses, for such a 16K memory. The compare operation may also be performed one row at a time, so that in the same example of a typical 16K memory all 128 columns for corresponding rows of the EEPROM and DRAM are compared simultaneously. The EEPROM write cycle would be initiated if a difference existed between an EEPROM column and the corresponding DRAM column for that row. The time required for transfer of data to the EEPROM may be significantly reduced by this method of organizing the compare, particularly if the data transfer to the DRAM is in blocks of sequential address locations.

As observed earlier herein, it is not essential that the invention be limited to DRAMS and EEPROMS. Indeed, the principles of the invention are applicable to any non-volatile memory backup of volatile memory, provided there is sufficient compatibility in the logic associated with the respective memories. Also, it is not necessary that both memories be disposed on the same chip. An alternative preferred implementation is to incorporate the compare logic in the same chip with either the EEPROM or the DRAM.

Accordingly, although a preferred embodiment of the invention has been disclosed herein, it will be recognized by those skilled in the field to which the invention pertains that variations and modifications may be made without departing from the true spirit and scope of the invention. It is intended, therefore, that the invention be limited only to the extent required by the appended claims and the applicable rules of law.

What is claimed is:

1. A system for backing up volatile memory with non-volatile memory, in which the volatile memory has refresh logic for cycling through the volatile memory address locations and refreshing the contents thereof, and the non-volatile memory has write logic for writing data into address locations of the non-volatile memory over a write cycle, each of said volatile and non-volatile memories having its own address bus, said system comprising means connecting the address buses of the volatile and non-volatile memories together for reading out the contents of corresponding address locations thereof in the same sequence according to the cycle dictated by the volatile memory refresh logic, means for comparing the contents read out of each corresponding pair of address locations of the volatile and non-volatile memories in said sequence, and means responsive to a difference between the compared contents for disconnecting the address buses and initiating a write cycle of the non-volatile memory to transfer data representing the contents of the address location of the volatile memory found to differ into the corresponding address location of the non-volatile memory.

2. The invention according to claim 1, wherein said volatile memory is DRAM and said non-volatile memory is EEPROM.

3. The invention according to claim 2, further including means responsive to the completion of the EEPROM write cycle for reconnecting the address buses to reinstate the reading out of corresponding locations of the DRAM and EEPROM in said sequence.

4. The invention according to claim 2, wherein said means for disconnecting the address buses separates the EEPROM address bus from the DRAM refresh logic to eliminate further cycling through the EEPROM address locations during the EEPROM write cycle, while maintaining a connection between the DRAM refresh logic and the DRAM address bus to continue cycling through the DRAM address locations and refreshing the contents thereof during the EEPROM write cycle.

5. The invention according to claim 2, wherein said DRAM and said EEPROM are fabricated in the same monolithic semiconductor chip.

6. A method for backing up data stored in a volatile semiconductor memory having logic which cycles through address locations of the memory to refresh data contained therein, in which the backup is provided by a non-volatile semiconductor memory having a write cycle for entering data into address locations thereof which is considerably slower than the write cycle for the volatile memory, the method comprising the steps of:

reading data out of corresponding address locations of both memories in the sequence of the refresh logic cycle for the volatile memory, comparing data read out of each address location of the volatile memory with data read out of the corresponding address location of the non-volatile memory in said sequence, interrupting the read out sequence when the data stored in an address location of one of the memories differs from the data stored in the corresponding address location of the other memory, and writing the data found to be different, from the volatile memory into the corresponding address location of the non-volatile memory during the interruption, to make the data contained in corresponding address locations of the two memories identical to one another.

7. The method of claim 6, wherein the step of interrupting is performed to discontinue the cycling through address locations of the non-volatile memory only, while allowing the cycling through address locations of the volatile memory to continue for refreshing the data therein in said sequence.

8. The method of claim 7, further including the step of restarting the cycling through the address locations of both memories according to the refresh logic cycle sequence, after the differing data from the volatile memory has been written into the corresponding location of the non-volatile memory, to again read out data from corresponding address locations of the two memories in said sequence for comparison thereof.

9. The method of claim 6, wherein both memories are contained in the same semiconductor chip.

10. A memory system for backing up data in a volatile memory having a refresh logic cycle, with an associated non-volatile memory having a write cycle, which comprises:

means for comparing memory contents at corresponding address locations of said volatile and associated non-volatile memories;

means for selectively activating said comparing means to commence sequential comparison of the respective memory contents at said corresponding address locations through the refresh logic cycle of said volatile memory and the write cycle of said non-volatile memory, in a sequence and at a speed dictated by said refresh logic cycle; and writing means responsive to the comparing means detection of a difference between the respective memory contents from said comparison for writing data into the address location of one of said memories for equivalence with the contents of the corresponding address location of the other of said memories.

11. The invention of claim 10, wherein said writing means writes, as said data, the contents of the address location of said volatile memory which are detected by the comparison to differ, into the corresponding address location of said associated non-volatile memory to attain said equivalence.

12. The invention of claim 10, further including means further responsive to said comparison means detection of a difference to allow said refresh logic cycle of said volatile memory to continue while inhibiting said selective activating means from effecting comparisons during said writing of data.

13. A method for backing up a volatile memory which has its contents periodically and sequentially refreshed in a refresh cycle, with non-volatile memory, comprising the steps of:

comparing memory contents at corresponding address locations of said volatile and non-volatile memories while sequencing through said corresponding locations in said refresh cycle of said volatile memory; and upon detecting a discrepancy between the contents at said corresponding address locations, writing into the address location of one of said memories from which the discrepancy arose to make the contents of the last-mentioned address location equivalent to the contents of the corresponding address location of the other of said memories.

14. The method of claim 13 wherein the comparing step is interrupted while the writing step is being performed, without interrupting said refresh cycle of said volatile memory.

* * * * *